United States Patent
Watanabe et al.

(10) Patent No.: US 7,109,661 B2
(45) Date of Patent: Sep. 19, 2006

(54) ELECTROLUMINESCENCE LIGHT EMITTING DISPLAY SYSTEM

(75) Inventors: Kimitaka Watanabe, Tokyo (JP); Hiroyuki Yamanaka, Chiba (JP)

(73) Assignee: Tomy Company, Ltd., Tokyo (JP)

( * ) Notice: Subject to any disclaimer, the term of this patent is extended or adjusted under 35 U.S.C. 154(b) by 274 days.

(21) Appl. No.: 10/447,275

(22) Filed: May 29, 2003

(65) Prior Publication Data

US 2004/0041516 A1 Mar. 4, 2004

(30) Foreign Application Priority Data

Aug. 30, 2002 (JP) ............................ 2002-254617
Apr. 25, 2003 (JP) ............................ 2003-122728

(51) Int. Cl.
*G09F 9/00* (2006.01)

(52) U.S. Cl. ............... 315/169.3; 313/505; 313/510
(58) Field of Classification Search ............ 315/169.1, 315/169.3; 313/505, 507, 506, 509, 510; 40/544
See application file for complete search history.

(56) References Cited

U.S. PATENT DOCUMENTS

| | | |
|---|---|---|
| 3,067,530 A | 12/1962 | Bolsey |
| 3,152,994 A | 10/1964 | Thomton, Jr. et al. |
| 3,290,537 A | 12/1966 | Logan |
| 3,443,332 A | 5/1969 | Christy |
| 3,641,533 A | 2/1972 | Sylvander |
| 3,740,616 A | 6/1973 | Suzuki et al. |
| 4,345,249 A | 8/1982 | Togashi |
| 4,590,381 A | 5/1986 | Mendelson |
| 4,686,110 A | 8/1987 | Endo et al. |

(Continued)

FOREIGN PATENT DOCUMENTS

| | | |
|---|---|---|
| EP | 1 164 621 | 12/2001 |
| GB | 2 063 544 | 6/1981 |
| GB | 735752 | 8/1995 |
| JP | 59-25197 | 2/1984 |
| JP | 4-51795 | 4/1992 |
| JP | 2001-52875 | 6/1996 |
| JP | 2001-337633 | 12/2001 |
| JP | 2002-50486 | 2/2002 |
| JP | 2002-050474 | 2/2002 |
| JP | 2003-173880 | 6/2003 |
| JP | 2003-243964 | 8/2003 |
| WO | WO 00/55743 | 9/2000 |

OTHER PUBLICATIONS

U.S. Appl. No. 10/620,422, filed Jul. 17, 2003, Watanabe et al., Tomy Company, Ltd.

(Continued)

*Primary Examiner*—David Vu
(74) *Attorney, Agent, or Firm*—Staas & Halsey LLP

(57) ABSTRACT

An electroluminescent light emitting system, having an electroluminescent light-emitting layer containing electroluminescent light-emitting elements, one surface side of which receives an AC electric field forming material thereon; an electrode section including a first electrode layer with a predetermined first pattern and a second electrode layer with a predetermined second pattern, which are disposed relatively close to but electrically spaced from each other on another surface side of the electroluminescent light emitting layer; and a waterproof resin layer provided between at least one of the first electrode layer and the second electrode layer electrode section, and the electroluminescent light-emitting layer. The AC electric field forming material on the one surface side enables an AC electric field to be generated in the electroluminescent light-emitting layer with an AC voltage applied between the first electrode layer and the second electrode layer.

17 Claims, 11 Drawing Sheets

U.S. PATENT DOCUMENTS

| | | | |
|---|---|---|---|
| 5,301,982 A | | 4/1994 | Brotz |
| 5,319,491 A | | 6/1994 | Selbrede |
| 5,351,143 A | | 9/1994 | Sato et al. |
| 5,483,120 A | | 1/1996 | Murakami |
| 5,551,905 A | | 9/1996 | Billings et al. |
| 5,594,562 A | | 1/1997 | Sato et al. |
| 5,597,183 A | | 1/1997 | Johnson |
| 5,598,285 A | | 1/1997 | Kondo et al. |
| 5,674,104 A | | 10/1997 | Ohashi et al. |
| 5,677,546 A | | 10/1997 | Yu |
| 5,680,160 A | | 10/1997 | LaPointe |
| 5,737,051 A | | 4/1998 | Kondo et al. |
| 5,793,158 A | * | 8/1998 | Wedding, Sr. .............. 313/493 |
| 5,852,509 A | | 12/1998 | Coleman |
| 5,977,704 A | | 11/1999 | Shi et al. |
| 6,084,007 A | | 7/2000 | Narukawa et al. |
| 6,091,382 A | * | 7/2000 | Shioya et al. ................ 345/76 |
| 6,124,915 A | | 9/2000 | Kondo et al. |
| 6,144,156 A | | 11/2000 | Lutschounig et al. |
| 6,183,262 B1 | | 2/2001 | Tseng |
| 6,205,690 B1 | | 3/2001 | Heropoulos et al. |
| 6,271,626 B1 | | 8/2001 | Ford et al. |
| 6,297,812 B1 | | 10/2001 | Ohara et al. |
| 6,326,735 B1 | | 12/2001 | Wang et al. |
| 6,341,004 B1 | | 1/2002 | Kondo et al. |
| 6,348,908 B1 | | 2/2002 | Richley et al. |
| 6,727,647 B1 | | 4/2004 | Fukuda et al. |
| 2001/0018809 A1 | | 9/2001 | Heropoulos et al. |
| 2002/0017857 A1 | | 2/2002 | Hashimoto et al. |
| 2002/0180712 A1 | | 12/2002 | Sato et al. |
| 2003/0197461 A1 | | 10/2003 | Fukuda et al. |

OTHER PUBLICATIONS

U.S. Appl. No. 10/624,682, filed Jul. 23, 2003, Watanabe et al., Tomy Company, Ltd.
U.S. Appl. No. 10/637,590, filed Aug. 11, 2003, Watanabe et al., Tomy Company, Ltd.
U.S. Appl. No. 10/637,574, filed Aug. 11, 2003, Watanabe et al., Tomy Company, Ltd.
U.S. Appl. No. 10/651,210, filed Aug. 20, 2003, Watanabe et al., Tomy Company, Ltd.
Patent Abstracts of Japan; Publication No. 2003–243,964; Published Aug. 29, 2003.
Patent Abstracts of Japan; Publication No. 2003–173,880, Published Jun. 20, 2003.
Japanese Abstract, 08153582, Jun. 11, 1996.
Japanese Abstract, 10189244, Jul. 21, 1998.
European Search Report Dated Jan. 16, 2004.

* cited by examiner

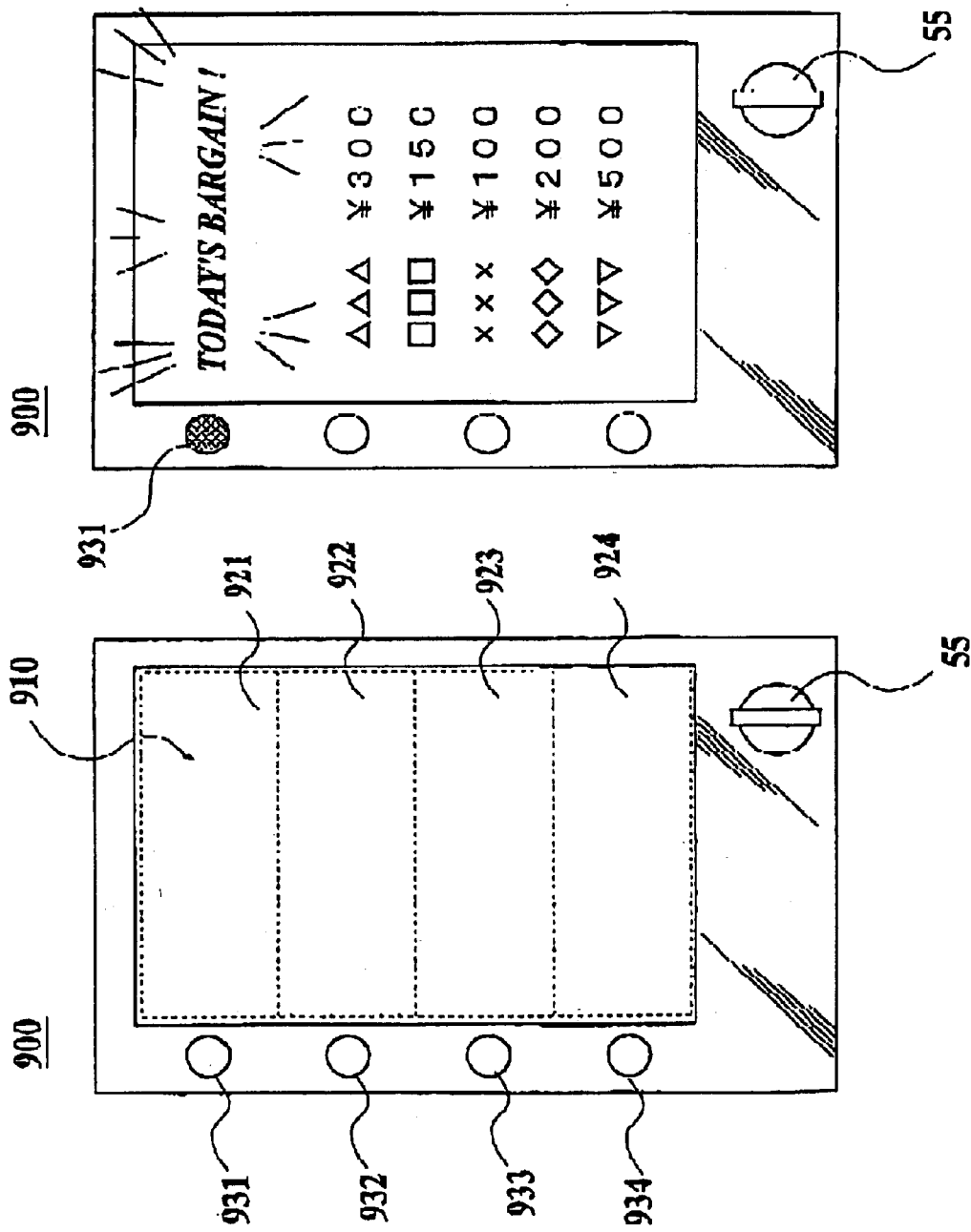

ELECTROLUMINESCENCE LIGHT EMITTING DISPLAY SYSTEM

BACKGROUND OF THE INVENTION

1. Field of the Invention

The present invention relates to an electroluminescence light emitting system including an EL light emitting layer.

2. Description of the Related Art

An electroluminescence, hereinafter, which may be referred to EL simply, material is known as one of light emitting materials. Various types of EL light emitting sheets have been developed and put to practical use. The EL light emitting sheet is generally formed by laminating a first electrode, a light-emitting layer, an insulating layer, i.e., a light reflecting layer, a second electrode and a protective layer in order. Generally, by applying an alternating voltage (AC voltage) between the first electrode and the second electrode, a fluorescent material, i.e., EL light emitting elements, in the light-emitting layer emits light.

As another type of EL light emitting sheet, one having peculiar operation and effects is known (see, for example, Patent Document 1: Japanese Patent Laid-Open Publication No. Hei 8-153582). The EL light emitting sheet is formed by laminating an electrode section, an insulating layer and a light-emitting layer in order. The electrode section includes a plurality of electrode pairs each of which have a first electrode and a second electrode, which are formed like a comb. Then, an electrically conductive material in arbitrary shape is formed on the light-emitting layer as a film and the film is dried to be formed as a display electrode. Thereby, the parts in the light-emitting layer on which the display electrode is formed an a film emit light. In the EL light emitting sheet, a display electrode having a shape corresponding to the taste of a user can be formed, and then a desired light emission shape can be obtained.

However, the EL light emitting sheet disclosed in Patent Document 1 cannot form the display electrode easily, since the method needs to form the electrically conductive material on the light-emitting layer as a film and dry it. Further, since the EL sheet only emits light, it is monotonous and insipid. Such an EL sheet also has a disadvantage of not attracting attention in case of being used as, for example, a signboard.

SUMMARY OF THE INVENTION

The present invention has been developed in view of the above-described circumstances.

An object of the invention is to make it possible to place or coat the electrically conductive material and to remove it easily, and to realize various change of light emission.

In accordance with a first aspect of the present invention, the electroluminescence light emitting display system comprises:

an electroluminescence light emitting sheet (for example, EL light emitting sheet 10 in FIG. 1) which comprises: a light-emitting layer (for example, EL light emitting layer 14 in FIG. 1) containing electroluminescence light-emitting elements therein, and an electrode section (for example, electrode layer 12 in FIG. 1) comprising an electrode pair including first and second electrodes which are electrically separated from each other with a spacing region and disposed in one surface side of the light-emitting layer with a predetermined arrangement;

a voltage application unit (for example, voltage application unit 120 in FIG. 5) for applying a predetermined voltage between the first and second electrodes of the electrode pair;

a body (for example, body 59 in FIG. 3) for supporting the electroluminescence light emitting sheet; and a control unit (for example, control unit 110 in FIG. 5) for controlling execution of voltage application to the first and second electrodes of the electrode pair by the voltage application unit, wherein when a conductive chart for light emitting is drawn on the other surface side of the light-emitting layer by putting an electrically conductive material (for example, conductive material 30 in FIG. 1) thereon and a voltage application between the electrode pair is performed by the voltage application unit, a portion of the light-emitting layer corresponding to the putted electrically conductive material emits light, and the system allows repeated drawing or removing by using a removing member (for example, removing member 58 in FIG. 3) for removing the electrically conductive material putted on; and the control unit realizes a plurality of light emitting modes which are different from one another in light emitting system and/or light emitting range, of the chart for light emitting. In the present invention, the EL display system includes various types of EL display products, e.g., EL display devices, EL display signboards, EL display toys such as EL display toys for a child to draw favorite figures thereon, or the like.

According to the first aspect of the invention, it is possible to draw various charts for light emitting repeatedly and to remove the charts, and further to realize various light emission by drawn charts, which are different from one another in light emitting system and/or light emitting range, by changing the light emitting mode.

In the electroluminescence light emitting display system, the electrode section may comprise a base film, and a metal layer with a predetermined pattern, which are formed by depositing a metal such as copper, aluminum or the like on the base film and by etching the deposited metal layer to have the predetermined pattern.

According to the system having such a structure, the thickness of the electrode section can be small because of being formed by a deposited metal layer. In a case of the electrode section by a deposition of aluminum, even if a user, for example, scratches the EL light emitting sheet with a cutter or strikes a nail, only a part of the aluminum layer contacting with the cutter or the nail is melted almost simultaneously with the shortage. Consequently, the worst case where the whole of the electrode layer 12 is shorted is not generated, and the user does not receive electric shock.

In the first aspect of the invention, the electrode section may comprise: a first line layer (for example, first electric potential line layer 830 in FIG. 8) including a plurality of first lines which are provided in parallel to one another in a first direction; a second line layer (for example, second electric potential line layer 820 in FIG. 8) including a plurality of second lines which are provided in parallel to one another in a direction perpendicular to the first direction; and a terminal layer (for example, electrode terminal layer 810 in FIG. 8) including a plurality of first terminals which are connected to the first line layer by passing through the second line layer, and a plurality of second terminals which are connected to the second line layer, the first terminals and the second terminals being alternately arranged in a predetermined order, in a plan view, wherein the first line layer, the second line layer and the terminal layer are laminated in order, and the terminal layer is adhered to one surface side of the light-emitting layer.

According to the system having such a structure, by performing selection control of the electric potential lines to which predetermined voltages (AC voltages) are applied, regions in the closed circuit formation possible state or in the closed circuit formation impossible state can arbitrarily be controlled. For example, in a case that the electrically conductive material is putted on (placed, coated, adhered, applied or the like) all over the drawing screen, it is possible to emit light so that arbitrary characters or charts are raised up. Moreover, it is also possible to realize various light emission patterns such as enlargement of the area of parts emitting light in concentric circles.

The electroluminescence light emitting sheet may comprise a waterproof layer (for example, waterproof layer 13 in FIG. 1) between the light-emitting layer and the electrode section.

According to the system having such a structure, the electrode section can be protected by the waterproof layer from touching the outside. As a result, the corrosion of the electrode section and detective products of the electroluminescence light emitting sheet can be decreased, and thereby a product life can be extended.

Preferably, a protective layer is fixed on the other surface side of the light-emitting layer and the one surface side of the light-emitting layer allows the electrically conductive material to be putted thereon.

According to the system having such a structure, it can be prevented that a liquid electrically conductive material permeates the light-emitting layer through a pinhole and the like. Moreover, the smoothness of the external surface of the electroluminescence light emitting sheet and the removability at the time of removing the electrically conductive material are improved.

The chart for light emitting may be drawn by a pen having an impregnating material impregnating a liquid electrically conductive material.

Accordingly, the electrically conductive material can simply and easily he putted (placed, coated, adhered, applied or the like) on the light-emitting layer.

The voltage application unit may comprise a dry cell as a power source and converts a DC voltage supplied from the dry cell to an AC voltage, to apply the AC voltage between the first and second electrodes of the electrode pair.

According to the system having such a voltage application unit, since no alternating current power supply is necessary, the electroluminescence light emitting display can easily be located to be used.

Preferably, the body comprises a holding portion for holding at least one of a pen having an impregnating material impregnating a liquid electrically conductive material and the removing member.

According to the system having such a structure, the pen and the removing member, which are indispensable to use the electroluminescence light emitting display, are made to be difficult to lose, and the availability of the electroluminescence light emitting display can be improved.

The electrode section may comprise a plurality of electrode pairs which are disposed in a predetermined arrangement, and the control unit may realize a plurality of light emitting modes which are different from one another in light emitting system and/or light emitting range, of the chart for light emitting, by controlling execution of voltage application to the first and second electrodes of each electrode pair by the voltage application unit.

According to the system having such a structure, since the voltage application to the plural electrode pairs can be controlled, various light emitting mode can be realized.

The system may further comprise a selection section (for example, change-over switch 55 in FIG. 3) for selecting one from a plurality of light-emitting modes, and the control unit may control execution of voltage application to the first and second electrodes of each electrode pair by the voltage application unit, on the basis of the light-emitting mode selected by the selection section. Accordingly, it is possible to realize selection of a light-emitting mode easily.

The plurality of light-emitting modes may include at least a plurality of modes having light emitting systems different from one another, and the light emitting systems may include at least two selected from (1) an entirely light-emitting mode in which execution of voltage application to all of the electrode pairs is controlled simultaneously, (2) an entirely blinking mode in which execution of voltage application to all of the electrode pairs is controlled simultaneously and intermittently, (3) a sequentially light-emitting mode in which execution of voltage application to the electrode pairs is controlled in a predetermined order, and (4) a wavy light-emitting mode in which execution of voltage application to the electrode pairs is controlled in a predetermined order and intermittently.

The system may further comprise a setting member (for example, control unit 110 in FIG. 10, and control unit 110 when using the electrode section 800 in FIG. 10) for setting a light emitting region and/or a light emitting form, and the control unit may select a part of the electrode pairs, to control execution of voltage application to the selected electrode pair by the voltage application unit.

According to the system having such a construction, it is possible to make a specific region emit light or not emit light by setting the light emitting region. Moreover, a light-emitting shape (part) can be changed by setting a light emitting form.

The system may further comprises a waterproof layer provided in a front side of the electrode section, the waterproof layer being colored so as to make the electrode pattern of the electrode section invisible from the front side.

According to the system having such construction, such coloring enables not only making the electrode pattern invisible from the front side but also widening the range of choice for design from the front side. In a case of providing a light reflecting layer 16, it is required to arrange the light reflecting layer 16 near the EL light emitting layer in comparison with the waterproof layer 13.

BRIEF DESCRIPTION OF THE DRAWINGS

FIGS. 9A and 9B are plan views of a signboard according to variation 1 of the EL light emitting display system;

DETAILED DESCRIPTION OF THE PREFERRED EMBODIMENTS

Hereinafter, the preferred embodiments of the present invention will be described in detail by reference to the attached drawings.

A. EL Light Emitting Sheet

1. Whole Configuration

Figure 1:
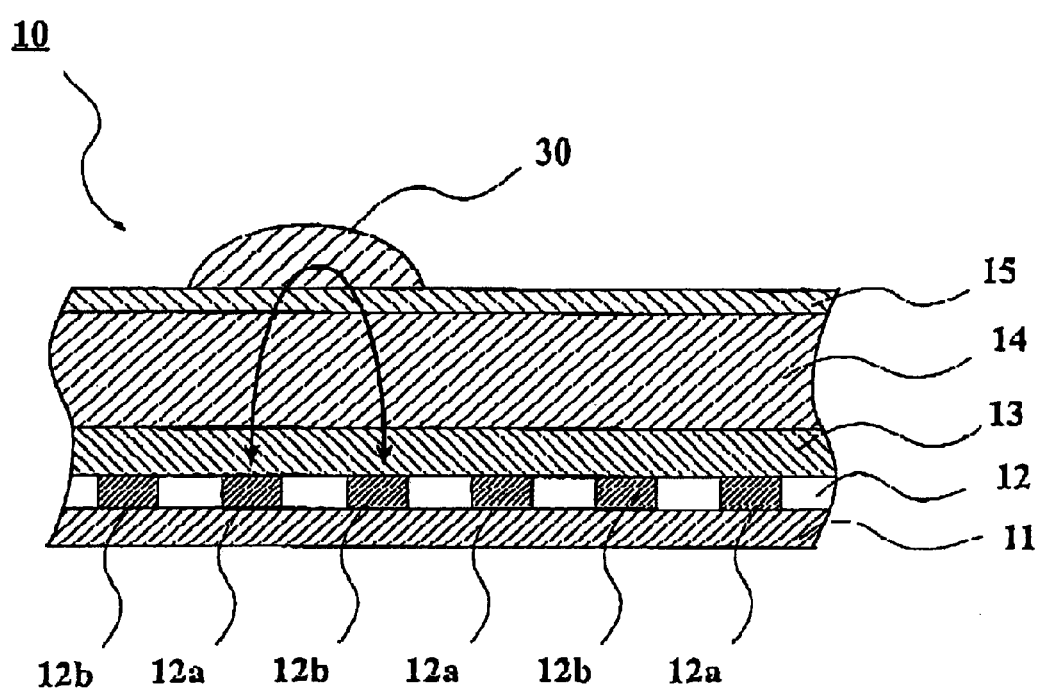
FIG. 1 is a partially enlarged sectional view of a principal part of an EL light emitting sheet.

FIG. 1 is an enlarged sectional view of a principal part of an EL light emitting sheet 10 to which the present invention is applied. In FIG. 1, the EL light-emitting sheet 10 is formed by laminating a base layer 11, an electrode layer (electrode section) 12, a waterproof layer 13, an EL light-emitting layer 14 and a top coat layer 15 in order.

2. Detailed Configuration (1) Base Layer 11

The base layer 11 is made of an insulating material such as polyethylene terephthalate (PET) or the like. The base layer 11 may be configured as a base film (substrate sheet). In this case, the base film is made of a transparent or opaque resin. As the resin in this case, for example, PET is used. Incidentally, the base layer 11 may be made of glass.

(2) Electrode Layer 12

The electrode layer 12 having a predetermined electrode pattern is formed by depositing a metal such as copper, aluminum or the like on the base layer 11, and by performing etching or the like to the deposited metal layer. Alternatively, the electrode layer 12 is formed by depositing, for example, a pasty silver paste including silver powder, a pasty copper paste including copper powder, another electrically conductive paste such as carbon, or the like on the base layer 11 in a predetermined pattern by the screen printing, and thereafter by performing the heat drying processing of the paste.

Figure 2:
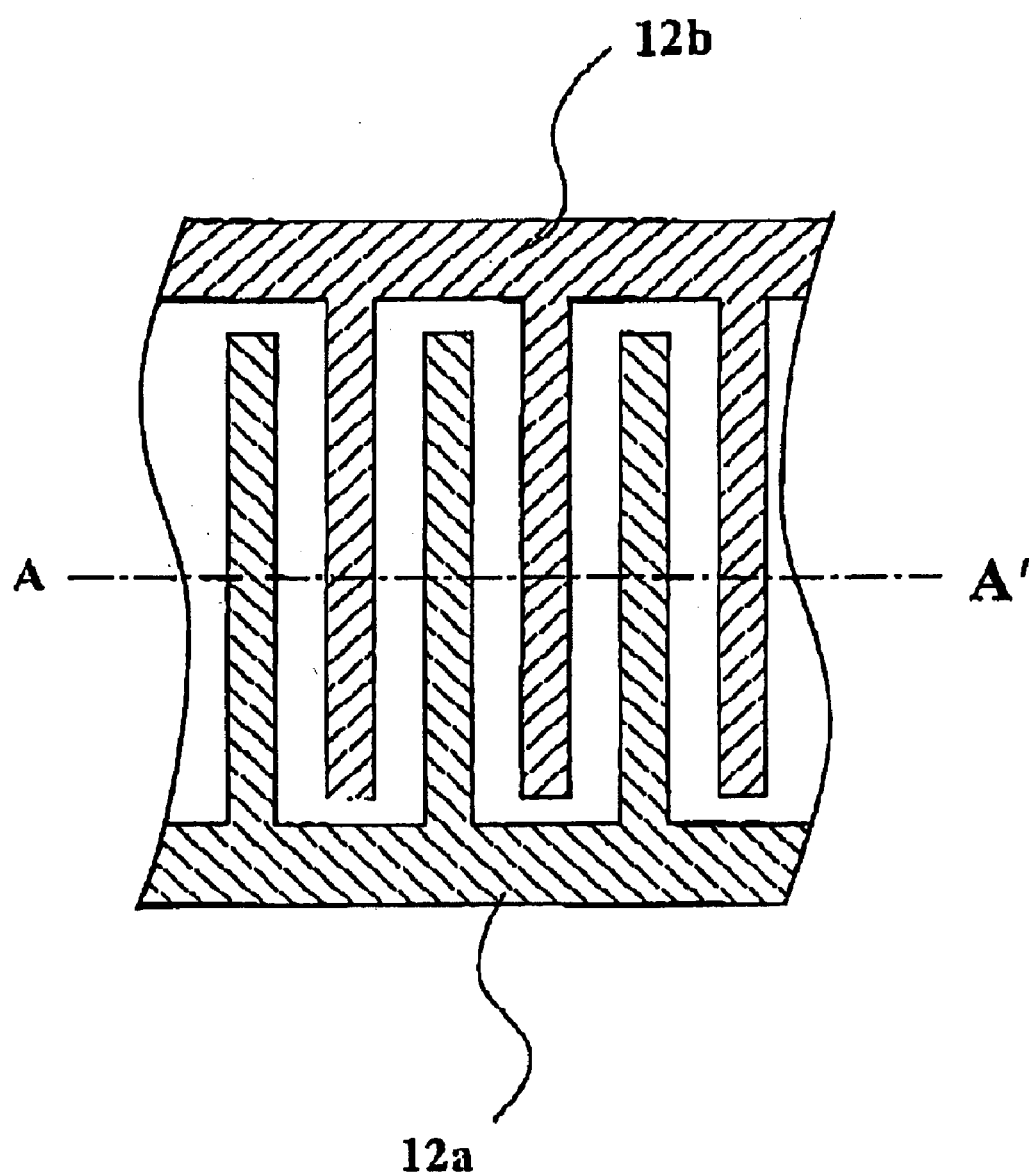
FIG. 2 is a schematic plan view showing a part of an electrode layer.

FIG. 2 is a schematic plan view showing a part of the electrode layer 12. The electrode layer 12 of FIG. 1 shows the cross section of the electrode layer 12, taken along the A–A' line of FIG. 2. As shown in FIG. 2, an electrode 12a and an electrode 12b are formed to have a comb-like pattern shape severally, and they are formed to be engaged with each other with a predetermined interval between their tooth with putting a spacing region between each tooth so that each tooth does not touch each other. Since each electrode 12a is electrically connected with one another, each of them has the same electric potential. Since each electrode 12b is also electrically connected with one another similarly, each of them has the same electric potential.

Incidentally, it is preferable to form the first electrode 12a and the second electrode 12b so that the spacing regions may substantially be the same per a unit area in a light emitting region.

The gap of, for example, about 0.1–2.0 mm, between the first electrode 12a and the second electrode 12b which are next to each other is enough, and the width sizes of the first electrode 12a and the second electrode 12b themselves, for example, of about 0.1–5.0 mm, are enough, in a case of considering light emission only.

However, in a case of putting on (placing, adhering, applying or the like) a conductive chart 30 for light emission, of a thin line which is approximately parallel to the extending direction of comb-shaped pattern electrode, or in a case of putting on a dot-shaped conductive chart 30 for light emission, the gap of about 0.2–0.3 mm, between the first electrode 12a and the second electrode 12b which are next to each other is preferable, and the width sizes of the first electrode 12a and the second electrode 12b themselves, of about 0.2–0.5 mm, are preferable.

The reason for the above-described definition of gap or size is as follows.

When the gap between the first electrode 12a and the second electrode 12b is less than 0.2 mm, there is a large possibility that a light emission (natural light) which is not negligible is created in also a region onto which no conductive material is placed. When the gap is more than 0.3 mm, particularly, in a case of placing a chart of a thin line, flecks of light emission stand up. Under conditions, that is, EL sheet size of 140 mm×92 mm, starting voltage of 250V to 270V and current of 100 mA to 130 mA, luminance of emitted lights from two EL light emitting sheets which have gaps of 0 2 mm and 0.15 mm, respectively, were compared. As a result, the luminance of emitted lights from the EL light emitting sheet having a gap of 0.2 mm was 3±0.5 candela and that of 0.15 mm was 6±0.5 candela which was approximately twice that of 0.2 mm gap case. Therefore, it is considered that when assuming a regular use condition in an ordinary room as an industrial product, the luminance of emitted light, of 3±0.5 candela which is obtained by the gap of 0.2 mm is a lower limit.

On the other hand, when the width sizes or the first electrode 12a and the second electrode 12b themselves are less than 0.2 mm, there are problems that the luminance of emitted lights is lowered and the productivity deteriorates by bridge or disconnection, occurred in mass production. When the width sizes are more than 0.5 mm, there is a problem that in a case of putting on a dot-shaped chart for light emission by using a pen for drawing a thin line, probability of AC electric field formation with another electrode is lowered because of placed thin chart being within the width of one electrode. When the width sizes are not more than 0.5 mm, the probability of AC electric field formation with another electrode is increased because the probability of the placed dot shaped chart being out of the one electrode is much larger than that of the chart being placed at the center of the one electrode.

Thus, it is possible to increase the probability of AC electric field formation, to restrain occurrence of flecks of light emission for a chart such as a character, and to form a beautiful light emitting chart.

(3) Waterproof Layer 13

The waterproof layer 13 is a layer for protecting the electrode layer 12 and is made of a resin. As the resin, the following resins can be used. That is, they are, for example, a fluorocarbon resin such as a 4-fluorinated ethylene resin, fluorocarbon and the like; a silicon resin such as silicon rubber and the like; the other epoxy resins; an acrylic resin; a urethane resin; a polyester resin; and a resin having a high sealing property such as an ethylene-vinyl acetate copolymer and the like. These resins are cured by a method such as ultraviolet (UV) curing, infrared (IR) curing, two-liquid curing, heat curing and the like.

(4) EL Light-Emitting Layer 14

The EL light-emitting layer 14 is made of organic or inorganic EL light-emitting elements (fluorescent material) sealed with a sealing resin. The EL light-emitting elements are fixed with being dispersed in a transparent resin binder.

As the resin binder, a resin having a high dielectric constant such as a polyester resin or the like is suitably selected. The EL light-emitting layer 14 has a thickness of about 30–40 μm, a withstanding voltage of about 50–150 V, and a dielectric constant of about 10–30. The thickness of the EL light-emitting layer 14 is preferably one and a half times as large as the diameter of an EL light emitting element or more. With such a thickness, the surfaces of the EL light-emitting layer 14 is regarded as being smooth, and for example, their surface roughness is regarded as being 30 μm or less.

The EL light-emitting layer 14 configured as above emits the light of a predetermined luminescent color such as a bluish green color when an AC power supply voltage is applied between the first electrode 12a and the second electrode 12b.

(5) Top Coat Layer 15

The top coat layer 15 is stuck or fixed, closely to the EL light-emitting layer 14 to protect the EL light-emitting layer 14. The top coat layer 15 is laminated on the EL light-emitting layer 14 also for improving the smoothness of the EL light-emitting layer 14 and the removability of an electrically conductive material 30. If the EL light-emitting layer 14 itself can secure necessary smoothness and removability, it is needless to provide the top coat layer 15 specially.

As the top coat layer 15, the following resins can be used. That is, they are, for example, a fluorocarbon resin such as a 4-fluorinated ethylene resin, fluororubber and the like; a silicon resin such as silicon rubber and the like; a polyester resin; a urethane resin and the like. Since the main object of providing the top coat layer 15 is, as described above, to smooth the surface of the EL light-emitting layer 14 and to improve the removability, the thickness of the top coat layer 15 is enough to be a degree which makes it possible to attain the object. On the other hand, it is suitable that the top coat layer 15 is as thin as possible. The reason for this is that the more the thickness is, the more the luminous intensity of the EL light-emitting sheet 10 decreases. The thickness is practically preferable to be about 1–2 μm as the effective value. Hereupon, the "effective value" means the size of the thickness of the top coat layer 15 adhering to the uppermost part of the EL light-emitting layer 14. It is sufficient for obtaining the thickness of about 1–2 μm as the effective value to make the coating value of the thickness about 5–8 μm. Hereupon, the "coating value" means the thickness of the protection layer 15 when the coating is performed on a surface having no irregularities.

The top coat layer 15 may be formed by gluing a film-like or sheet-like member fixedly onto the EL light-emitting layer 14, or by adhering a flexible material member thereto.

(6) Electrically Conductive Material 30

As the electrically conductive material 30, the following known materials can be used. That is, they are: a stick type painting material such as an ink, a pencil, a crayon, a pastel and the like; a sheet material having electrical conductivity (hereinafter referred to as a conductor sheet) and the like. As the stick type painting material such as the ink, the pencil, the crayon, the pastel and the like, ones including an organic or an inorganic coloring pigment may be used.

As the ink, one having the following properties is preferable. The properties are, for example, to have a surface resistance value equal to or less than $10^6$ O/? in the state of being coated, to have optical transparency, and to include at least one kind of powder of the electrically conductive materials such as indium oxide, tin oxide, antimony, zinc oxide and the like. Further, as the ink, an electrically conductive polymer such as polyethylene dioxi thiophene and the like or a mixture of the electrically conductive polymer with the powder of the electrically conductive material may be used. In this case, it is possible to make the ink emit light for a long period until the removal of the ink by wiping or the like. Moreover, the electrically conductive material 30 may be composed of water or a solvent, which have a high dielectric constant. In this case, the electrically conductive material 30 can easily be removed by drying it with a dryer, or by wiping it with a tissue, a piece of gauze, a sponge and the like.

3. Operation

The electrically conductive material 30 is attached on the top coat layer 15 in a desired pattern. The attachment of the electrically conductive material 30 is performed by drawing with a brush (a pencil, a pastel or a crayon), by performing printing with an ink jet printer or screen printing, or by sticking an electrically conductive sheet. In the state, an AC power supply voltage is applied between the first electrode 12a and the second electrode 12b. Incidentally, the electrically conductive material 30 may be attached after the AC power supply voltage has previously been applied.

Then, by the attachment of the electrically conductive material 30, an AC electric field is formed in the EL light-emitting layer 14, and only the part just under the attached electrically conductive material 30 emits light locally. That is, since the EL light emitting layer 14 has a high dielectric constant, a circuit composed of the first electrode 12a, the EL light-emitting layer 14, the electrically conductive material 30, the EL light-emitting layer 14, the second electrode 12b and the like is formed to form an AC electric field in the EL light-emitting layer 14. Then, the part just under the attachment part of the electrically conductive material 30 emits light. On the other hand, the intensity of the AC electric field at the places just under the parts where the electrically conductive material 30 is not attached is insufficient for the EL light-emitting layer 14 to emit light, and consequently the parts do not emit light. The size of the thickness and the dielectric constant of the EL light emitting layer 14 or the like are set in order that the part just under the electrically conductive material 30 may emit light selectively.

When the electrically conductive material 30 is liquid, there is a case where the electrically conductive material 30 permeates the EL light-emitting layer 14 to reach the waterproof layer 13 through a scratch, a pinhole or the like. However, the waterproof layer 13 prevents the further permeation of the electrically conductive material 30. Moreover, the waterproof layer 13 also prevents the permeation of moisture or humidity in the air.

4. Advantageous Effects

According to the present embodiment, an AC electric field is formed at a part of the EL light-emitting layer 14 just under the attached electrically conductive material 30, and only the part locally emits light. This thing indicates that, if the electrically conductive material 30 is attached to the top coat layer 15 in the same pattern as a desired pattern, a desired light emitting pattern can be obtained. Consequently, an EL light emitting sheet 10 with which a user can easily produce a desired light emitting pattern can be provided.

The electrode layer 12 of the EL light emitting sheet 10 is, as described above, formed by the deposition of a metal. If it is intended to form the electrode layer 12 by, for example, deposition of aluminum, the thickness of the electrode layer 12 is about 300–1,000 Å ($10^{10}$ m). preferably about 400–800 Å. Since the electrode layer 12 is very thin layer and formed by the deposition of aluminum, if a user, for example, scratches the EL light emitting sheet with a cutter or strikes a nail, only a part of the electrode layer 12 contacting with the cutter or the nail is melted almost simultaneously with the shortage. Consequently, the worst case where the whole of the electrode layer 12 is shorted is not generated, and the user does not receive electric shock.

Further, it is possible to change the luminescent color of the EL light emitting sheet 10 by forming the EL light-emitting layer 14 by sealing the EL light-emitting elements with a coloring pigment mixed therein, by disposing a color filter between the EL light-emitting layer 14 and the top coat layer 15, by coloring the top coat layer 15, or by mixing a coloring pigment with the electrically conductive material 30.

B. EL Light Emitting Display System

Figure 3:
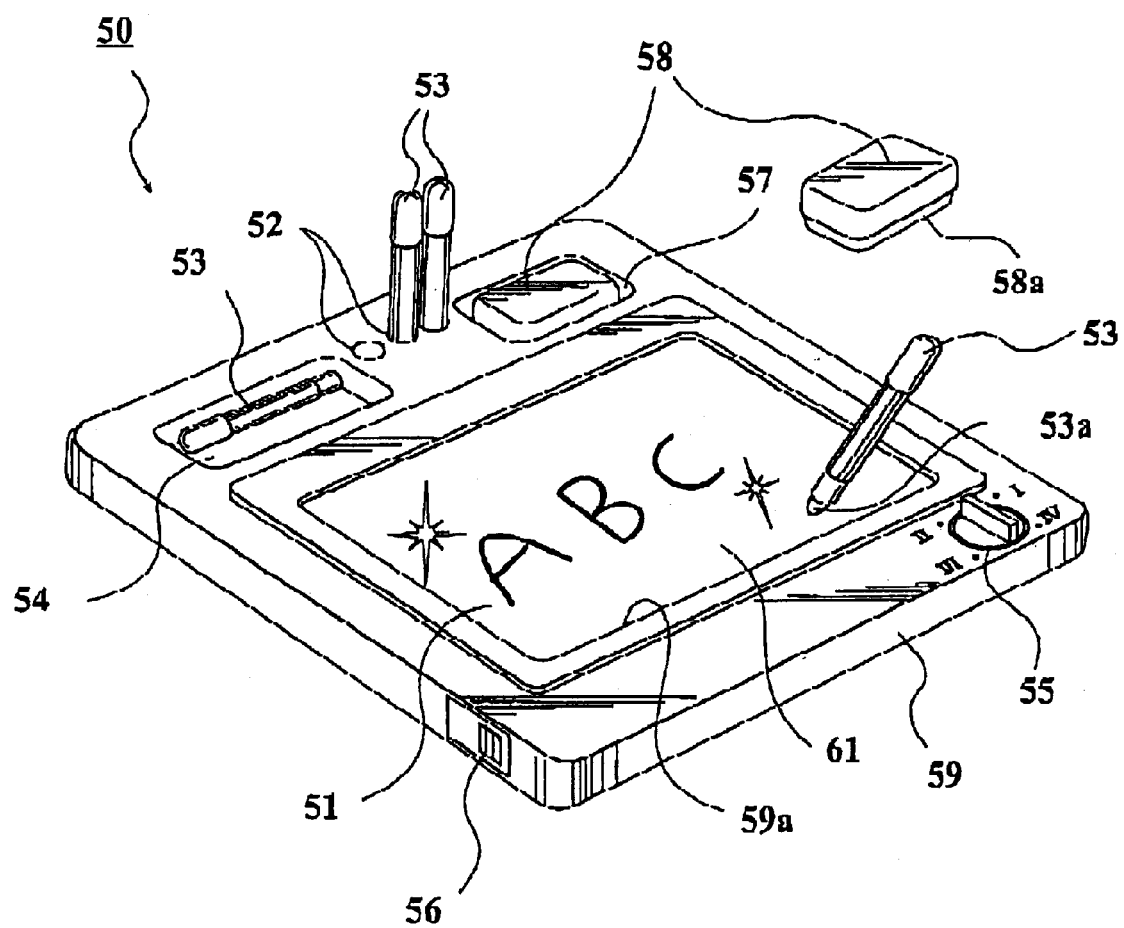
FIG. 3 is a perspective view of the external appearance of a drawing board.

FIG. 3 is a perspective view showing the external appearance of a drawing board 50 as an example of an EL light emitting display system incorporating the above-mentioned EL light emitting sheet therein.

1. Whole Configuration

In the drawing board 50, a main body 59 shaped to be a board having a predetermined thickness holds the EL light emitting sheet 51 which is provided in the inside of the main body. The EL light emitting sheet 51 having the top coat layer 15 on the top surface thereof is exposed from an opening 59*a*. The drawing board 50 is configured to be provided with a highlight pen 53 having a pen point 53*a* made of an impregnating material impregnating the electrically conductive material 30 using electrically conductive ink including a fluorescent material, holders 52 for holding the highlight pens 53 in the state of standing up, a tray 54 having a shape of a recess capable of holding the highlight pens 53 in the state of lying on their sides in the inside of the tray 54, a removal member 50 carrying a sponge 58*a*, which is superior in water absorbing property, for removing the electrically conductive member 30, a tray 57 for holding the removal member 58 in a state capable of being taken out, a change-over switch 55 for switching light-emitting modes, and a power supply switch 56.

2. How to Use

A user takes a pen 53 from the tray 54, and draws an arbitrary light emitting chart by applying the electrically conductive material 30 on a drawing screen 61, namely the top surface part of the top coat layer 15 exposed from the opening 59*a*. In FIG. 3, a word "ABC" is drawn. Then, when the power supply switch 56 is turned on, a closed circuit is formed with the electrically conductive material 30, the electrodes 12*a*, 12*b*, and the like. Consequently, the EL light-emitting layer 14 emits light, and the emitted light is transmitted through the electrically conductive material 30 to be radiated. That is, since the lower parts where the pen 53 has drawn emit light, the drawing acts as if the characters "A", "B" and "C" themselves were emitting light.

3. Detailed Configuration
(1) Electrode Pattern

Next, an electrode pattern of the EL light emitting sheet 51 built in the drawing board 50 will be described.

Figure 4:
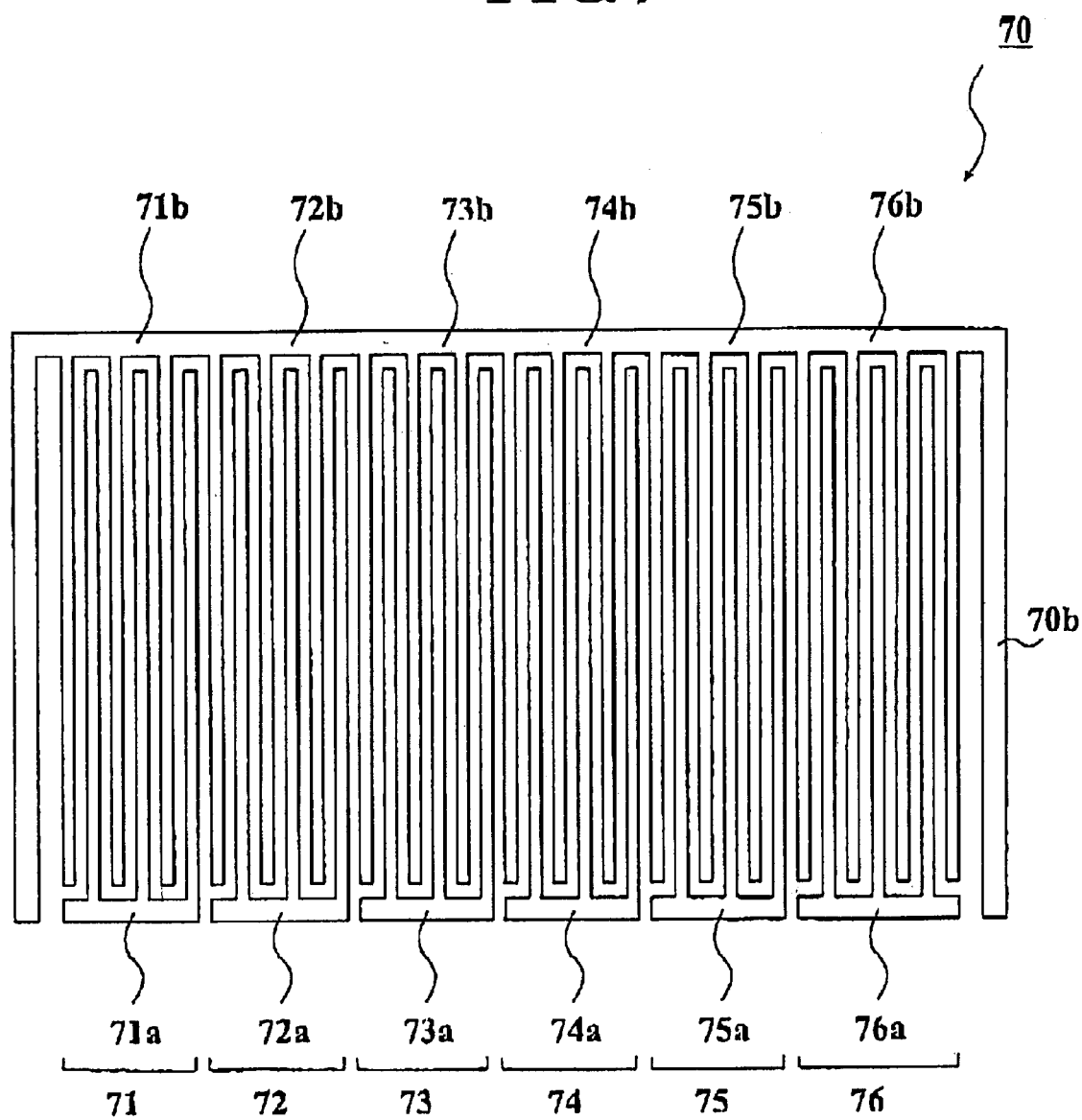
FIG. 4 is a plan view showing the external shape of the electrode pattern of the EL light emitting sheet built in the drawing board.

FIG. 4 is a plan view showing the outline of the electrode pattern 70 of the EL light emitting sheet 57 built in the drawing board 50. The electrode pattern 70 means the shape of the electrode layer 12 formed on the base layer 11. In the figure, an electrode 71*a* and an electrode 71*b* constitute an electrode pair 71, and the electrode 71*a* and 71*b* have substantially the same figures as the comb-like pattern shapes of the electrodes 12*a* and 12*b*. The electrode pattern 70 includes six electrode pairs 71–76 having substantially the same configuration as the electrode pair 71 severally. The electrode pairs 71–76 are aligned. The upper end parts of the electrodes 71*b*–76*b* of respective electrode pairs 71 76 in the figure are connected with one another to form an electrode line (earth line) 70*b*, which is connected to the ground. On the other hand, the electrodes 71*a*–76*a* are not connected with one another.

Then, when a predetermined voltage (AC voltage) is applied to each of the electrodes 71*a*–76*a*, each of the electrode pairs 71–76 takes the state capable of forming a closed circuit. To put it more concretely, if the electrically conductive material 30 is coated on the drawing screen 61 when the voltage is applied to all of the electrodes 71*a*–76*a*, a closed circuit is formed between the electrically conductive material 30 and an electrode pair at any place on the drawing screen 61 through the EL light-emitting layer 14 and the like. However, if the voltage is applied to only a part of the electrodes 71*a*–76*a*, only the part of the electrode pair corresponding to the electrode to which the voltage is applied can form a closed circuit (the sate is referred to as a "closed circuit formation possible state", and a state other than the above-mentioned state is referred to as a "closed circuit formation impossible state" in the present specification).

(2) Internal Circuits

Figure 5:
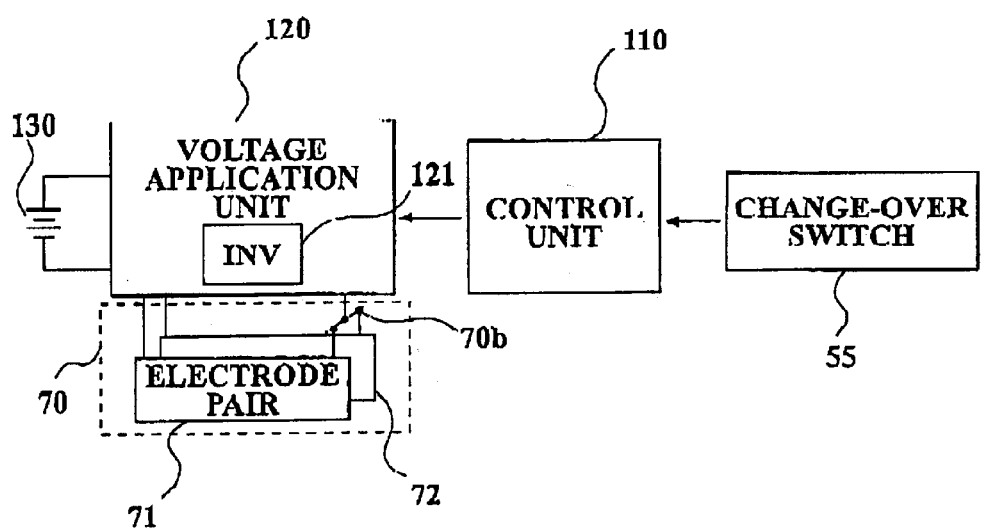
FIG. 5 is a functional block diagram of the drawing board.

FIG. 5 is a functional block diagram of the drawing board 50. In the figure, the drawing board 50 is provided with a control unit 110 composed of a central processing unit (CPU), a random access memory (RAM), a read only memory (ROM) and the like, a battery 130 composed of dry cells, and a voltage application unit 120. The voltage application unit 120 includes an inverter circuit 121 for converting a direct-current (DC) voltage supplied from the battery 130 to an AC voltage, and a booster circuit (not shown). The voltage application unit 120 applies an effective AC voltage of about 100–300 V between the earth line 70*b* of the electrode pattern 70 and each of the electrode pair 71–76 according to a control signal input from the control unit 110.

The control unit 110 stores programs instructing the procedures of applying the voltage to the electrode pattern 70 into the ROM at every light emitting mode. The control unit 110 reads a corresponding program according to a mode selection signal which is input from the change-over switch 55, and outputs a control signal to the voltage application unit 120.

Then, various light emitting modes can be realized by controlling the voltage application to the electrode pairs 71–76. In the drawing board 50, an entirely light-emitting mode (mode I), an entirely blinking mode (mode II), a sequentially light-emitting mode (mode III) and a wavy light-emitting mode (mode IV) are executed by the switching of the change-over switch 55.

(3) Light-Emitting Modes
(a) Entirely Light-Emitting Mode

The entirely light-emitting mode is a mode in which an voltage is applied to all of the electrode pair 71–76 simultaneously and continuously. In other words, the mode is one in which all of the electrode pairs 71–76 are in the closed circuit formation possible state. If the electrically conductive material 30 is coated on all over the drawing screen 61, the whole surface of the drawing screen 61 continuously emits light.

(b) Entirely Blinking Mode

The entirely blinking mode is a mode in which a voltage is applied to all of the electrode pairs 71–76 simultaneously and intermittently. In other words, the mode is one in which all of the electrode pairs 71–76 simultaneously take the closed circuit formation possible state or the closed circuit formation impossible state alternately at predetermined time intervals. If the electrically conductive material 30 is coated on all over the drawing screen 61, the whole surface of the drawing screen 61 intermittently emits light.

(c) Sequentially Light-Emitting Mode

The sequentially light-emitting mode is a mode in which a voltage is accumulatively applied to the electrode pairs 71–76 in the order of their arrangement. In other words, the mode is one in which the electrode pairs 71–76 which have been in the closed circuit formation impossible state sequentially become the closed circuit formation possible state at predetermined time intervals. If the electrically conductive material 30 is coated on all over the drawing screen 61, an area part of one sixth of the whole area of the drawing screen 61 sequentially emits light (since there are six electrode pairs), and the area emitting light gradually increases. Incidentally, after all of the electrode pairs have become the closed circuit formation possible state, the application of the voltage to all of the electrode pairs 71–76 is stopped after a predetermined time to make all of the electrode pairs 71–76 be in the closed circuit formation impossible state. Thereby, the electrode pairs 71–76 return to the initial state, and the execution of the sequential light-emitting is repeated.

(d) Wavy Light-Emitting Mode

The wavy light-emitting mode is a mode in which a voltage is intermittently applied to the electrode pairs 71–76 in the order of their arrangement. In other words, the mode is one in which each of the electrode pairs 71–76 repeatedly transits the closed circuit formation possible state and the closed circuit formation impossible state with a predetermined time lag. If the electrically conductive material 30 is coated on all over the drawing screen 61, each area part of one sixth of the whole area of the drawing screen 61 sequentially emits light and does not emit light, and consequently the parts emitting light operates to appear as if they were moving while waving.

4. Advantageous Effects

As described above, in the drawing board 50, it is possible to draw a light emitting chart by applying the electrically conductive material 30 easily with the highlight pen 53. Moreover, it is also possible to remove the coated electrically conductive material 30 easily. Consequently, the repeating drawing of charts for light emitting can easily be realized.

Furthermore, a plurality of electrode pairs are formed in the EL light emitting sheet, and the control unit 110 controls the execution of the voltage application to each electrode pair. Thereby, light-emitting modes for light emitting charts can variously be changed, which makes it possible to realize interesting light emission together with the aid of the variation of the places where the electrically conductive material 30 is coated.

Incidentally, it is needless to say that the EL light emitting display system may be applied to other toys. In that case, the toys are not limited to the ones aiming to draw the light emitting charts like the EL light emitting display toys (for example, the drawing board 50), but the toys may be ones incorporating the EL light emitting display system as a part of them.

C. Variations of EL Light Emitting Sheet

1. Variation 1 of EL Light Emitting Sheet (1) Whole Configuration

Figure 6:
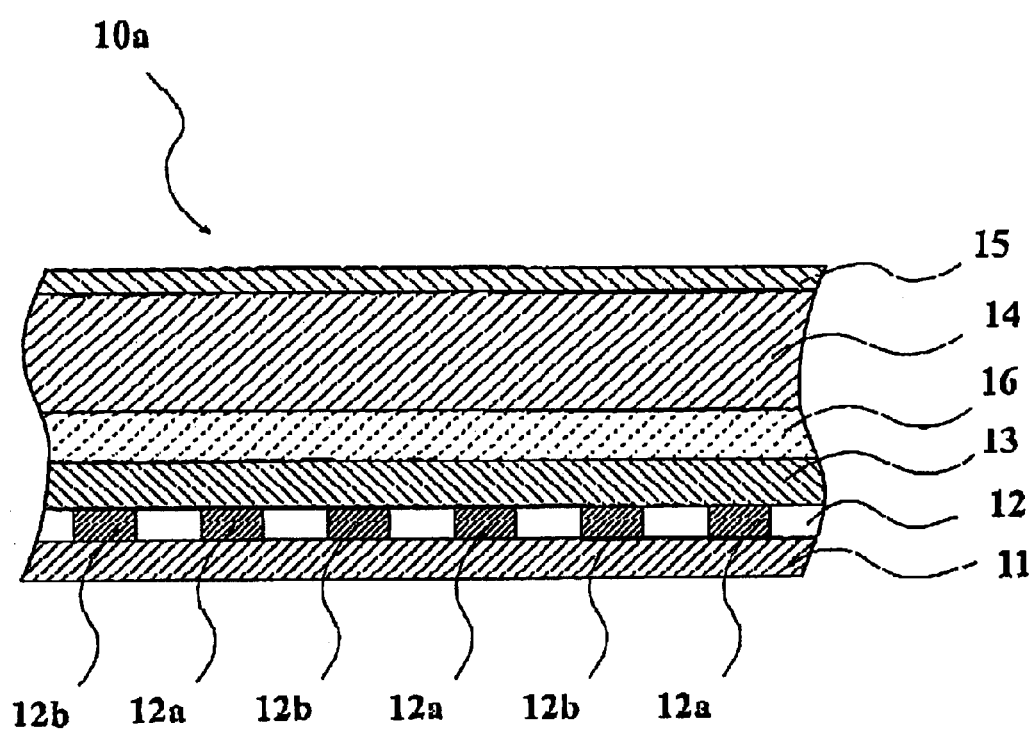
FIG. 6 is a partially enlarged sectional view of a principal part according to variation 1 of the EL light emitting sheet.

As shown in FIG. 6, the EL light emitting sheet 10a according to the variation 1 has a configuration in which a base layer 11, an electrode layer 12, a waterproof layer 13, a light reflecting layer 16, an EL light emitting layer 14 and a top coat layer 15 are laminated in this order. Since each structure of the base layer 11, the electrode layer 12, the waterproof layer 13, the EL light-emitting layer 14 and the top coat layer 15 is substantially the same as that of the EL light emitting sheet 10 in the embodiment of the present invention, the same reference numeral as that of the sheet 10 is attached to each element and the description for them are omitted. Mainly, the light-reflecting layer 16 will be described in the following (2) Detailed Configuration The light-reflecting layer 16 is arranged between the waterproof layer 13 and the EL light-emitting layer 14. The light-reflecting layer 16 adheres to the EL light-emitting layer 14. The light-reflecting layer 16 has a thickness of about 10–30 μm, a withstanding voltage of about 200–300 V, and a dielectric constant of about 30–100, preferably about 60–100.

The light-reflecting layer 16 is made by dispersing inorganic powder which is ferroelectric powder such as barium titanate or Rochelle salt, into a resin functioning as a bonding agent such as an acrylic resin or the like. Since the inorganic powder such as the ferroelectric powder is a pigment showing white, the light-reflecting layer 16 becomes white, and therefore the light-reflecting layer 16 exhibits the light-reflecting function effectively.

2. Variation 2 of EL Light Emitting Sheet

Although in the variation 1, the waterproof layer 13 is arranged between the electrode layer 12 and the light-reflecting layer 16, in the variation 2, the waterproof layer 13 is arranged between the light-reflecting layer 16 and the EL light-emitting layer 14. In this case, the top coat layer 15 are not necessarily required.

3. Variation 3 of EL Light Emitting Sheet

Variation 3 is one that a further change is given to variation 1. The EL light emitting sheet according to the variation 3 has a structure in which a base layer 11, one of first and second electrodes 12a and 12b, a waterproof layer 13, the other of first and second electrodes 12a and 12b, a light reflecting layer 16, and an EL light-emitting layer 14 are laminated in this order. In this case, the top coat layer 15 are not necessarily required, and the light reflecting layer 16 may be omitted.

4. Variation 4 of EL Light Emitting Sheet

Variation 4 is one that a further change is given to variation 1. The EL light emitting sheet according to the variation 4 has a structure in which a base layer 11, one of first and second electrodes 12a and 12b, a light reflecting layer 16, a waterproof layer 13, the other of first and second electrodes 12a and 12b, and an EL light-emitting layer 14 are laminated in this order. In this case, the top coat layer 15 are not necessarily required.

5. Variation 5 of EL Light Emitting Sheet

Variation 5 is one that a further change is given to the EL light emitting sheet 10, 10a or 51 according to the embodiment, or one of variations 1–4. The EL light emitting sheet according to the variation 5 has a structure in which the EL light-emitting layer 14 and/or the light reflecting layer 16 has a permeation prevention function to water or the like, instead of or in addition to the waterproof layer 13. In this case, the top coat layer 15 is not necessarily required.

The EL light-emitting layer 14 with the permeation prevention function is composed of, for example, organic or inorganic EL light-emitting elements being phosphor particles or phosphorescent particles, and a transparent resin binder for fixing the EL light-emitting elements in the state of being dispersed. The variation 5 uses a resin having a waterproof property or a moisture-proof property as the resin binder. The following resins are used. That is, the resins are, for example, a fluorocarbon resin such as a 4 fluorinated ethylene resin, fluororubber and the like; a silicon resin such as silicon rubber and the like; the other epoxy resins; an acrylic resin; a urethane resin; a polyester resin;

and a resin having a high sealing property such as an ethylene-vinyl acetate copolymer and the like. These resins are cured by a method such as the UV curing, the IR curing, the two-liquid curing, the heat curing and the like.

Further, as the resins constituting the light-reflecting layer 16 having the permeation prevention function, the following resins having the waterproof property or the moisture-proof property are used. The resins are, for example, a fluorocarbon resin such as a 4-fluorinated ethylene resin, fluororubber and the like; a silicon resin such as silicon rubber and the like; the other epoxy resins; an acrylic resin; a urethane resin; a polyester resin; and a resin having a high sealing property such as an ethylene-vinyl acetate copolymer and the like. These resins are cured by a method such as the UV curing, the IR curing, the two-liquid curing, the heat curing and the like.

According to the variation 4, since the light-reflecting layer 16 prevents the permeation of water and the like, the generation of electrolysis between the first electrode 12a and the second electrode 12b can be prevented. Moreover, the snapping (damage) of a wire caused by the oxidation of the first electrode 12a and the second electrode 12b can be prevented.

6. Variation 6 of EL Light Emitting Sheet

In the variation 6, the first electrode 12a and the second electrode 12b are formed on the back surface of a base film or a sheet of glass (base layer 11) which have a permeation prevention function. As the base film in this case, one made of, for example, polyethylene terephthalate (PET) is used.

According to the variation 6, since the base film or the sheet of glass prevents the permeation of water and the like from the front side, the generation of electrolysis between the first electrode 12a and the second electrode 12b can be prevented. Moreover, the snapping (damage) of a wire caused by the oxidation of the first electrode 12a and the second electrode 12b can be prevented.

Incidentally, the configuration is used in the case where the EL light emitting sheet is incorporated in a case body or the like. In the case where the EL light emitting sheet is incorporated in the case body as described above, the back surface side is generally sealed not to be exposed. Consequently, it is needless to consider the attachment of water and the like from the back surface side. If necessary, it is enough to coat the exposing electrodes with a resin having the permeation prevention function, or to perform the alumite processing of the exposing electrodes.

Incidentally, although the first electrode 12a and the second electrode 12b are provided on the back surface of the substrate sheet in the variation 6, the first electrode 12a and the second electrode 12b may be provided with pulling the substrate sheet between them.

7. Variation 7 of EL Light Emitting Sheet

Figure 7:
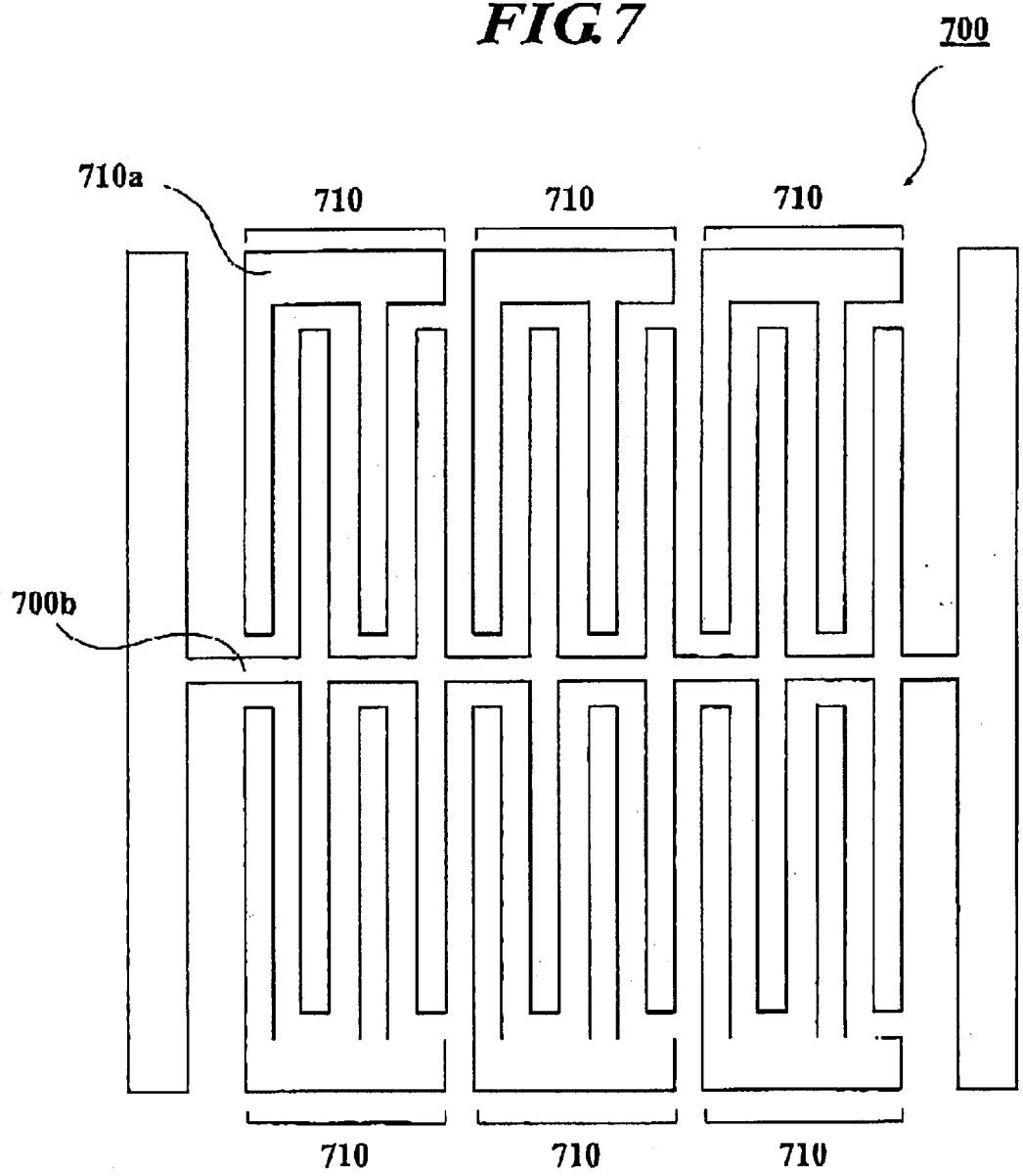
FIG. 7 is a plan view showing the external shape of the electrode pattern according to variation 7 of the EL light emitting sheet.

FIG. 7 shows the outline of the electrode pattern of the variation 7. In the figure, the electrode pattern 700 is a two dimensional arrangement composed of six comb-shaped electrode pairs 710 in all, three of which are arranged at the upper row in the right and left direction in the figure, and the other three of which are arranged at the lower row in the right and left direction in the figure. Moreover, the electrode pairs 710 are arranged so that the electrodes of each electrode pair are engaged in the upper and lower direction in the figure. Then, the electrode end of the earth side electrode of each electrode pair is integrally formed as an earth line 700b between the upper row electrode pairs and the lower electrode pairs of the two rows. In a case of putting on a conductive chart for light emission, of a thin line, or in a case of putting on a dot shaped conductive chart for light emission, the gap of about 0.2–0.3 mm, between the first electrode 12a and the second electrode 12b which are next to each other is preferable, and the width sizes of the first electrode 12a and the second electrode 12b themselves, of about 0.2–0.5 mm, are preferable.

By means of the electrode pattern 700, a wide variety of light emitting patterns can be formed with the six electrode pairs in all.

Furthermore, owing to the arrangement of the earth line 700b between the upper row electrode pairs and the lower row electrode pairs of the two rows, the interval of the upper row electrode pairs and the lower row electrode pairs can be narrowed. That is, if a displacement side electrode 710a is arranged between the upper row electrode pairs and the lower row electrode pairs at the two rows, it is impossible to connect the upper row electrode 710a and the lower row electrode 710a cannot connected with each other, and then it is necessary to arrange them with a predetermined space between them. Consequently, the gap between the upper row and the lower row of the two rows becomes wide, and the gap becomes clear in some light emission patterns. On the other hand, if the earth line 700b is arranged at the center, it becomes possible to remove, or at least to reduce, the defect as above.

8. Variation 8 of EL Light Emitting Sheet

Figure 8A:
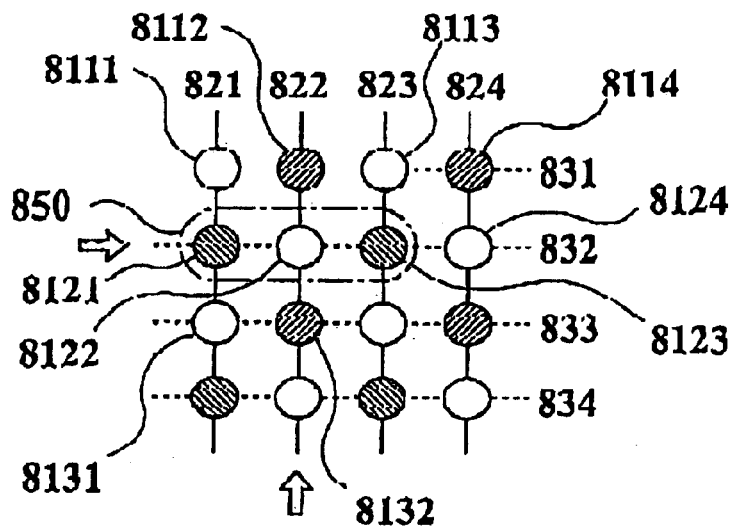
FIGS. 8A, 8B and 8C show the electrode section (electrode layer) according to variation 8 of the EL light emitting sheet schematically.
Figure 8B:
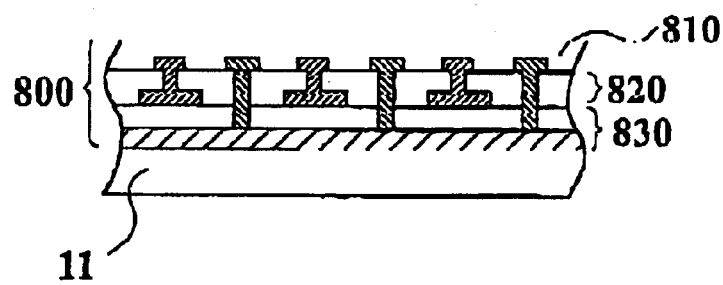
Figure 8C:
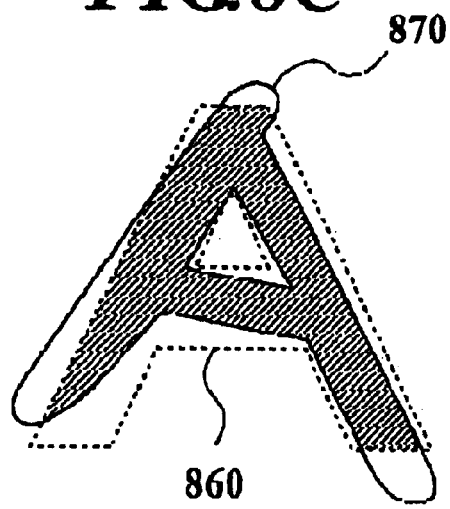

FIGS. 8A, 8B and 8C show the outline of the electrode section of the variation 8. The variation 8 is provided with an electrode section (electrode layer) 800 using a printed circuit board. FIG. 8A is a plan view of an enlarged substantial part of the electrode section 800 viewed from the side of an EL light-emitting layer. FIG. 8B is a sectional view at the electrode section 800. The electrode section 800 has a three layer configuration composed of a first electric potential line layer 830, a second electric potential line layer 820 and an electrode terminal layer 810. In the first electric potential line layer 830, a plurality of first electric potential lines 831, 832, 833 and 834 extending in the right and left direction in FIG. 8A are formed in parallel to one another. In the second electric potential line layer 820, a plurality of second electric potential lines 821, 822, 823 and 824 extending in the upper and lower direction in FIG. 8A are formed in parallel to one another. In the electrode terminal layer 810, the terminals' via holes, which are connected to any one of the first electric potential lines 831–834 or the second electric potential lines 821–824, are two-dimensionally arranged. In FIG. 8A, black circles indicate the terminals' via holes connected to the first electric potential lines, and white circles indicate the terminals' via holes connected to the second electric potential lines. The white circles and the black circles are alternately arranged in staggered fashion. For example, the terminals connected to the first electric potential line 831 are terminals 8112 and 8114, and the terminals connected to the second electric potential line 821 are terminals 8111 and 8131.

A first voltage is applied to the first electric potential lines 831–834, and a second voltage is applied to the second electric potential lines 821–824. The lines to which the voltages are applied are selected and controlled by the control unit. To put it concretely, for example, the first electric potential line 832 is selected as the line to which the first voltage is applied, and the second electric potential line 822 is selected as the line to which the second voltage is applied. In this case, the terminals 8121 and 8123 take the electric potential of the first voltage applied to the first electric potential line 832, and the terminals 8122 and 8142 take the electric potential of the second voltage applied to the second electric potential line 822. Consequently, owing to the potential difference between the terminal 8121 and the terminal 8122, and the potential difference between the terminal 8122 and the terminal 8123, a region 850 enclosed by an alternate long and short dash line in FIG. 8A becomes closed circuit formation possible state.

By forming an EL light emitting sheet by the use or the electrode section 800, and by performing selection control of the electric potential lines to which predetermined voltages (AC voltages) are applied, regions in the closed circuit formation possible state or in the closed circuit formation impossible state can arbitrarily be controlled. For example, in a case that the electrically conductive material 30 is coated all over the drawing screen, it is possible to emit light, i.e., to change the light emission form, so that arbitrary characters or charts are raised up. Moreover, it is also possible to realize various light emission patterns such as enlargement of the area of parts emitting light in concentric circles.

Further, a using method which is shown in FIG. 8C can also be carried out. FIG. 8C is a plan view of a part of a drawing screen. The figure shows a supposed case where a user is practicing how to write a character "A". A region 860 enclosed by broken lines is in the closed circuit formation possible state, and a region 870 enclosed by solid lines is a part of the electrically conductive material 30 coated with a highlight pen as a light emitting chart. In this case, the hatched portion where the region 860 and the region 870 are superposed on each other emits light.

In a case of putting on the conductive chart for light emission, of a thin line, or in a case of putting on the conductive dot-shaped chart for light emission, the gap of about 0.2–0.3 mm, between the first electrode 12a and the second electrode 12b which are next to each other is preferable, and the width sizes of the first electrode 12a and the second electrode 12b themselves, of about 0.2–0.5 mm, are preferable.

D. Variations of EL Light Emitting Display System

1. Variation 1 of EL Light Emitting Display System

A signboard 900 according to a variation of the EL light emitting system is shown in FIGS. 9A and 9B. The signboard 900 is provided with an EL light emitting sheet 910 therein. The EL light emitting sheet 910 includes rectilinearly arranged four electrode pairs formed by depositing aluminum on a base layer 11. Buttons 931, 932, 933 and 934 (hereinafter referred to as buttons 930 comprehensively) corresponding to each of the electrode pairs 921, 922, 923 and 924 (hereinafter referred to as electrode pairs 920 comprehensively) are arranged on one side of a drawing screen, i.e., the top surface of the top coat layer of the EL light emitting sheet. The EL light emitting sheet 910 and the signboard 900 have the same configuration sa those of the EL light emitting sheet 10 and the drawing board 50 except the arrangement configuration of the electrode pairs. The buttons 930 are made to be toggle switches. The buttons 930 are configured to output pushed signals when the buttons 930 are pushed down.

Figure 10:
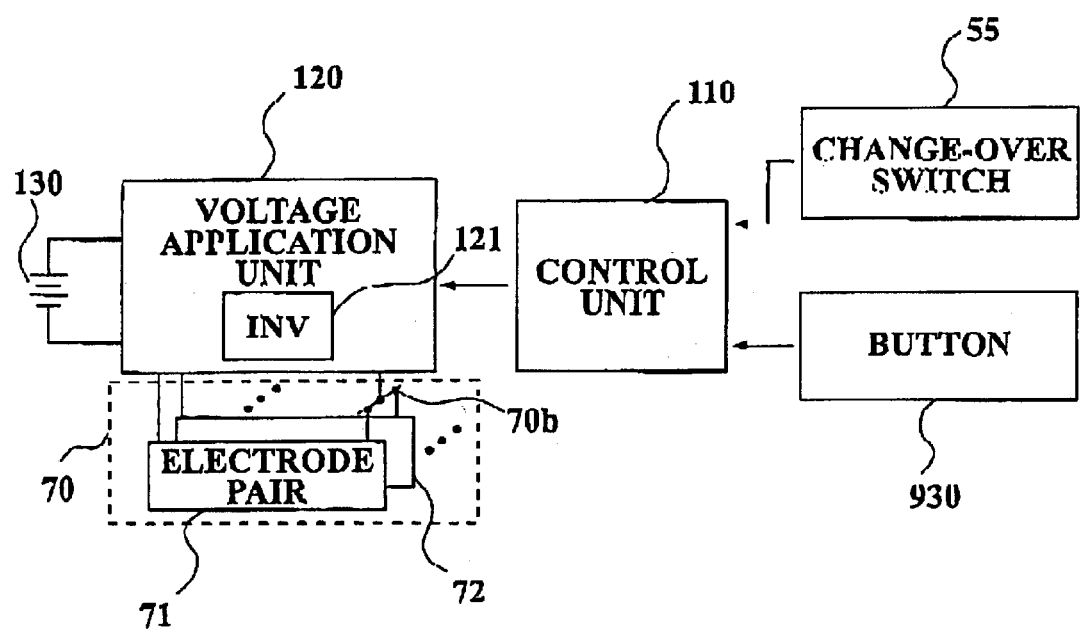
FIG. 10 is a control block diagram for the signboard according to variation 1 of the EL light emitting display system.

FIG. 10 is a control block diagram of the signboard 900. The configuration of the signboard is substantially the same as that of the drawing board 50 shown in FIG. 3. The configuration of the signboard is provided with the buttons 930. In FIG. 10, the control unit 110 selects and decides a region where light is to be emitted, that is, an electrode pair to which a predetermined voltage is applied on the basis of the pushed signal inputted from the buttons 930. For example, when the buttons 931 and 932 are pushed down, the control unit 110 selects and decides the electrode pairs 921 and 922. Then, the control unit 110 performs voltage application to the selected and decided electrode pairs 921 and 922 on the basis of the light emitting mode selected with the change-over switch 55.

FIG. 9B is a view showing an embodiment of the signboard 900 in the state in which the button 931 is pushed down. Since the electrode pair 921 is in the state of closed circuit formation possible state, the portion of the characters indicating "TODAY'S BARGAIN!", which have been drawn with the electrically conductive material 30, emit light in the region of the drawing screen where the electrode pair 921 is arranged.

Incidentally, the buttons 930 may be composed of change-over switches to make it possible to select light emitting modes in addition to the turning on and off, of the electrode pairs. In this case, for example, a light emitting form in which light emission is blinked in the region drawn as "TODAY'S BARGAIN!" while a continuous light emission is given in the other regions, can be realized.

2. Variation 2 of EL Light Emitting Display System (1) Schematic Configuration

Figure 11:
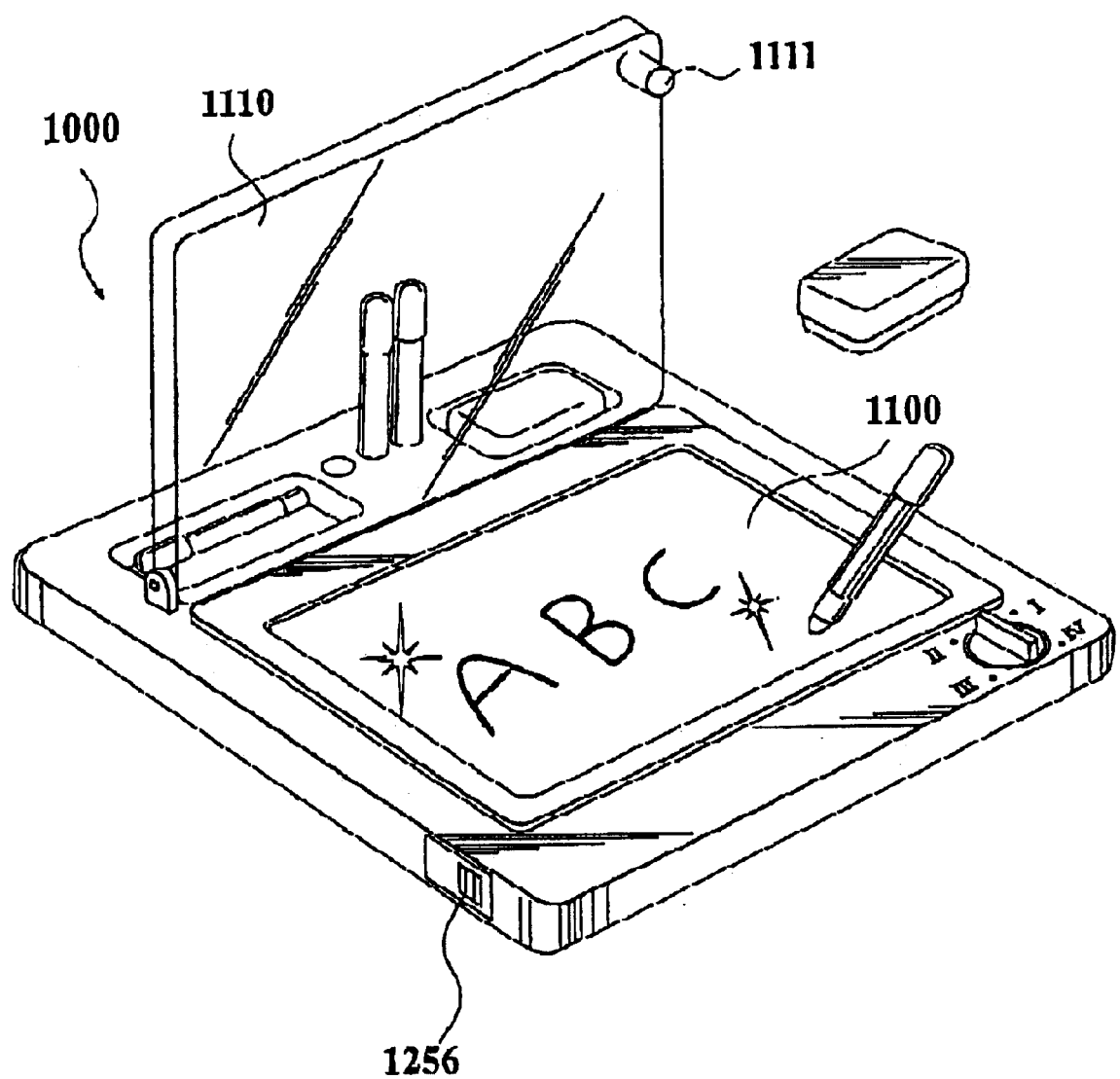
FIG. 11 is a perspective view of a drawing board according to variation 2 of the EL light emitting display system.

FIG. 11 is a perspective view showing an external appearance of a drawing board 1000 as an embodiment of the EL light emitting display system incorporating the above-mentioned EL light emitting sheets.

As shown in FIG. 11, the drawing board 1000 is provided with a transparent cover 1110 on an EL light emitting sheet 1100. The cover 1110 is configured to be capable of being opened and closed. On the back side of the cover 1110, a projection 1111 is annexed. The projection 1110 is provided to turn on a power supply control switch (not shown in the figure) which is arranged on the inside of the drawing board 1000 when the cover 1110 is closed. Other configurations and the like of the EL light emitting sheet 1100 are substantially the same as those of the drawing board 50.

(2) Function and Advantageous Effect

The EL light emitting display system does not work only by turning the power supply switch 1356 on. Only when both the power supply switch 1256 and the power supply control switch are turned on, the system does work to become in a closed circuit formation possible state. Therefore, even it the liquid electrically conductive material 30 penetrates into the EL light emitting sheet 1100 to short-circuit the electrode pair, no AC current are applied to the electrode pair unless the cover 1110 is closed. Accordingly, it is possible to enhance the safety.

E. Another Variation of the Invention (1) It is preferable to contain organic or inorganic colored pigment in the waterproof layer 13 of the EL light emitting sheet, to make the electrode pattern invisible from the front side by coloring. Such coloring enables not only making the electrode pattern invisible from the front side but also widening the range of choice for design from the front side. In a case of providing a light reflecting layer 16, it is required to arrange the light reflecting layer 16 near the EL light emitting layer in comparison with the waterproof layer 13.

(2) In the variation 2 of EL light emitting display system, a projection 1111 is annexed on the back side of the cover 1110, and when the cover 1110 is closed, the system works to become in a closed circuit formation possible state. However, opening and closing of the cover 1110 may be detected by any one of appropriate mechanical, electrical and optical manners, to become in a closed circuit formation possible state only when the cover 1110 is closed. Alternatively, a structure in which the power supply switch 1256 is locked during the cover 1110 is opened, may also be used.

Advantageous effects of typical embodiments of the present invention will be described. An electrically conductive material can simply and easily be applied with a pen or the like. Further, by using a removal member, a light emitting chart can repeatedly be drawn and removed. Furthermore, various light emitting modes can be realized.

The entire disclosure of Japanese Patent Application No. Tokugan 2003-122728 which was filed on Apr. 25, 2003, including specification, claims, drawings and summary are incorporated herein by reference in its entirety.

What is claimed is:

1. An electroluminescence light emitting display system comprising:
    an electroluminescence light emitting sheet which comprises: a light-emitting layer containing electroluminescence light-emitting elements therein, and an electrode section comprising an electrode pair including first and second electrodes which are electrically separated from each other with a spacing region and disposed in one surface side of the light-emitting layer with a predetermined arrangement,
    a voltage application unit for applying a predetermined voltage between the first and second electrodes of the electrode pair;
    a body for supporting the electroluminescence light emitting sheet; and
    a control unit for controlling execution of voltage application to the first and second electrodes of the electrode pair by the voltage application unit,
    wherein when a chart for light emitting is drawn on the other surface side of the light-emitting layer by putting an electrically conductive material thereon and a voltage application between the electrode pair is performed by the voltage application unit, a portion of the light-emitting layer corresponding to the electrically conductive material emits light, and the system allows repeated drawing or removing by using a removing member for removing the electrically conductive material put on; and the control unit realizes a plurality of light emitting modes which are different from one another in light emitting system and/or light emitting range, of the chart for light emitting.

2. The electroluminescence light emitting display system as claimed in claim 1, wherein the electrode section comprises a base film, and a metal layer with a predetermined pattern, which are formed by depositing a metal on the base film and by etching the deposited metal layer to have the predetermined pattern.

3. The electroluminescence light emitting display system as claimed in claim 1, wherein the electrode section comprises:
    a first line layer including a plurality of first lines which are provided in parallel to one another in a first direction;
    a second line layer including a plurality of second lines which are provided in parallel to one another in a direction perpendicular to the first direction; and
    a terminal layer including a plurality of first terminals which are connected to the first line layer by passing through the second line layer, and a plurality of second terminals which are connected to the second line layer, the first terminals and the second terminals being alternately arranged in a predetermined order, in a plan view,
    wherein the first line layer, the second line layer and the terminal layer are laminated in order, and the terminal layer is adhered to one surface side of the light emitting layer.

4. The electroluminescence light emitting display system as claimed in claim 1, wherein the electroluminescence light emitting sheet comprises a waterproof layer between the light-emitting layer and the electrode section.

5. The electroluminescence light emitting display system as claimed in claim 1, wherein a protective layer is fixed on the other surface side of the light-emitting layer and the electrically conductive material is put thereon.

6. The electroluminescence light emitting display system as claimed in claim 1, wherein the chart for light emitting is drawn by a pen having an impregnating material impregnating a liquid electrically conductive material.

7. The electroluminescence light emitting display system as claimed in claim 1, wherein the voltage application unit comprises a dry cell as a power source and converts a DC voltage supplied from the dry cell to an AC voltage, to apply the AC voltage between the first and second electrodes of the electrode pair.

8. The electroluminescence light emitting display system as claimed in claim 1, wherein the body comprises a holding portion for holding at least one of a pen having an impregnating material impregnating a liquid electrically conductive material and the removing member.

9. The electroluminescence light emitting display system as claimed in claim 1, wherein the electrode section comprises a plurality of electrode pairs which are disposed in a predetermined arrangement, and the control unit realizes a plurality of light emitting modes which are different from one another in light emitting system and/or light emitting range, of the chart for light emitting, by controlling execution of voltage application to the first and second electrodes of each electrode pair by the voltage application unit.

10. The electroluminescence light emitting display system an claimed in claim 9, wherein the system further comprises a selection section for selecting one from a plurality of light emitting modes, and the control unit controls execution of voltage application to the first and second electrodes of each electrode pair by the voltage application unit, on the basis of the light-emitting mode selected by the selection section.

11. The electroluminescence light emitting display system as claimed in claim 10, wherein the plurality of light-emitting modes include at least a plurality of modes having light emitting systems different from one another, and the light emitting systems include at least two selected from (1) an entirely light-emitting mode in which execution of voltage application to all of the electrode pairs is controlled simultaneously, (2) an entirely blinking mode in which execution of voltage application to all of the electrode pairs is controlled simultaneously and intermittently, (3) a sequentially light-emitting mode in which execution of voltage application to the electrode pairs is controlled in a predetermined order, and (4) a wavy light-emitting mode in which execution of voltage application to the electrode pairs is controlled in a predetermined order and intermittently.

12. The electroluminescence light emitting display system as claimed in claim 9, wherein the system further comprises a setting member for setting a light emitting region and/or a light emitting form, and the control unit selects a part of the electrode pairs, to control execution of voltage application to the selected electrode pair by the voltage application unit.

13. The electroluminescence light emitting display system as claimed in claim 1, further comprising a waterproof layer provided in a front side of the electrode section, the waterproof layer being colored so as to make the electrode pattern of the electrode section invisible from the front side.

14. The electroluminescent light emitting display system as claimed in claim 1, wherein the metal is copper or aluminum.

15. An electroluminescence light emitting display system comprising:

an electroluminescence light emitting sheet including a light-emitting layer containing electroluminescence light-emitting elements therein, and an electrode section having an electrode pair including first and second electrodes which are electrically separated from each other with a spacing region and disposed in one surface side of the light-emitting layer with a predetermined arrangement;

a voltage application unit for applying a predetermined voltage between the first and second electrodes of the electrode pair;

a body for supporting the electroluminescence light emitting sheet; and a control unit for controlling execution of voltage application to the first and second electrodes of the electrode pair by the voltage application unit, wherein when a chart for light emitting is drawn on the other surface side of the light-emitting layer by putting an electrically conductive material thereon and a voltage application between the electrode pair is performed by the voltage application unit, a portion of the light-emitting layer corresponding to the electrically conductive material emits light, and the system allows repeated drawing or removing by using a removing member for removing the electrically conductive material; and the control unit realizes a plurality of light emitting modes which are different from one another in the light emitting system and/or light emitting range, of the chart for light emitting, wherein the electroluminescence light emitting sheet includes a waterproof layer between the light-emitting layer and the electrode section, wherein the electrode section includes a base film, and a metal layer with a predetermined pattern, which are formed by depositing a metal on the base film and by etching the deposited metal layer to have the predetermined pattern, and wherein a protective layer is fixed on the other surface side of the light-emitting layer and the electrically conductive material is put thereon.

16. The electroluminescence light emitting display system as claimed in claim 1, wherein the first electrodes is a common electrode which corresponds to the plurality of second electrodes.

17. The electroluminescence light emitting display system as claimed in claim 1, wherein the electrode section comprises a plurality of electrode pairs that are substantially rectilinearly arranged.

* * * * *